(12) United States Patent
Yuan et al.

(10) Patent No.: US 10,446,784 B2
(45) Date of Patent: Oct. 15, 2019

(54) OLED DISPLAY PANEL, METHOD FOR PRODUCING THE SAME AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Zhidong Yuan, Beijing (CN); Yongqian Li, Beijing (CN); Can Yuan, Beijing (CN); Meng Li, Beijing (CN); Zhenfei Cai, Beijing (CN); Xuehuan Feng, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 0 days.

(21) Appl. No.: 15/979,143

(22) Filed: May 14, 2018

(65) Prior Publication Data

US 2019/0165296 A1    May 30, 2019

(30) Foreign Application Priority Data

Nov. 27, 2017    (CN) .......................... 2017 1 1206699

(51) Int. Cl.
*H01L 51/52*    (2006.01)
*H01L 51/56*    (2006.01)
*H01L 27/32*    (2006.01)

(52) U.S. Cl.
CPC ...... *H01L 51/5203* (2013.01); *H01L 27/3213* (2013.01); *H01L 27/3246* (2013.01); *H01L 27/3262* (2013.01); *H01L 51/56* (2013.01)

(58) Field of Classification Search
None
See application file for complete search history.

(56) References Cited

U.S. PATENT DOCUMENTS

2003/0094894 A1* 5/2003 Andry ................. H01L 27/3246
                                                313/506
2005/0140273 A1* 6/2005 Guo .................... H01L 27/3211
                                                313/504

(Continued)

OTHER PUBLICATIONS

Miller, Michael E., et al. "62.3: Exploiting the Flexibility of RGBW OLED Displays: Trading Color Saturation for Power." SID Symposium Digest of Technical Papers, vol. 40, No. 1, 2009, p. 935., doi:10.1889/1.3256952. (Year: 2009).*

(Continued)

*Primary Examiner* — J. E. Schoenholtz
(74) *Attorney, Agent, or Firm* — Kinney & Lange, P.A.

(57) ABSTRACT

An OLED display panel, a method for producing the same and a display device are provided. The OLED display panel includes: a substrate; and a plurality of sub-pixel areas on the substrate, each of the plurality of sub-pixel areas including a light emitting region and a non-light emitting region, wherein a plurality of insulation layers are in the non-light emitting region and a light emitting assembly is in the light emitting region, and wherein at most two insulation layers of the plurality of insulation layers extend from the non-light emitting region into the light emitting region between the light emitting assembly and the substrate, and wherein total number of the plurality of insulation layers in the non-light emitting region is greater than number of the insulation layers extending from the non-light emitting region into the light emitting region between the light emitting assembly and the substrate.

15 Claims, 4 Drawing Sheets

(56) References Cited

U.S. PATENT DOCUMENTS

| | | | | |
|---|---|---|---|---|
| 2008/0150434 A1* | 6/2008 | Sung | ................... | H01L 27/1214 |
| | | | | 315/169.3 |
| 2009/0140648 A1* | 6/2009 | Tohyama | ............ | H01L 27/3246 |
| | | | | 313/505 |
| 2013/0026476 A1* | 1/2013 | Park | ................... | H01L 27/3276 |
| | | | | 257/59 |
| 2014/0197385 A1* | 7/2014 | Madigan | ................. | H01L 51/56 |
| | | | | 257/40 |
| 2016/0056225 A1* | 2/2016 | Lee | .................... | H01L 27/3279 |
| | | | | 257/40 |

OTHER PUBLICATIONS

Murdoch, M.J., Miller, M.E. and Kane, P.J., "Perfecting the color reproduction of RGBW OLED", Proc. 30th International Congress of Imaging Science (ICIS 2006) (2006). (Year: 2006).*

Fang, Lu, et al. "Increasing Image Resolution on Portable Displays by Subpixel Rendering—a Systematic Overview." APSIPA Transactions on Signal and Information Processing, vol. 1, 2012, doi:10.1017/atsip.2012.3. (Year: 2012).*

* cited by examiner

OLED DISPLAY PANEL, METHOD FOR PRODUCING THE SAME AND DISPLAY DEVICE

CROSS-REFERENCE TO RELATED APPLICATION

This application claims the priority benefit of the Chinese Patent Application No. 201711206699.7 filed on Nov. 27, 2017 in the State Intellectual Property Office of China, the whole disclosure of which is incorporated herein by reference.

BACKGROUND

Technical Field

The present disclosure relates to the field of display technology, more particularly, to an organic light emitting diode (OLED) display panel, a method for producing the OLED display panel and a display device.

Description of the Related Art

An OLED (organic light-emitting diode) display device has characteristics such as self light emission, simple structure, super light weight, rapid response speed, wide vision angle, low power consumption and flexible display, thus it has been widely applied in the field of display.

In the related art, an OLED display device includes a display area and a non-display area. The display area includes a light emitting region and a non-light emitting region. The light emitting region contains an OLED unit and the non-light emitting region contains a thin film transistor.

SUMMARY

An embodiment of the present disclosure provides an organic light emitting diode display panel, including: a substrate; and a plurality of sub-pixel areas on the substrate, each of the plurality of sub-pixel areas comprising a light emitting region and a non-light emitting region, wherein a plurality of insulation layers are in the non-light emitting region and a light emitting assembly is in the light emitting region, and wherein at most two insulation layers of the plurality of insulation layers extend from the non-light emitting region into the light emitting region between the light emitting assembly and the substrate, and wherein total number of the plurality of insulation layers in the non-light emitting region is greater than number of the insulation layers extending from the non-light emitting region into the light emitting region between the light emitting assembly and the substrate.

In some embodiments, the non-light emitting region comprises a thin film transistor comprising an active layer, and a distance between a surface of the light emitting assembly facing the substrate and the substrate is smaller than a distance between a surface of the active layer facing the substrate and the substrate.

In some embodiments, the light emitting assembly is arranged directly on a surface of the substrate.

In some embodiments, the non-light emitting region comprises a thin film transistor, and the plurality of insulation layers comprise at least two of a buffer layer, a gate insulator layer, an interlayer dielectric layer and a passivation layer.

In some embodiments, the light emitting assembly emits light towards the substrate.

In some embodiments, the light emitting assembly comprises a first electrode, a second electrode and an electroluminescent layer between the first electrode and the second electrode.

In some embodiments, the first electrode is in direct contact with the substrate.

In some embodiments, the substrate is a glass substrate.

In some embodiments, three sub-pixel areas constitute one pixel area, and the light emitting assemblies in the three sub-pixel areas of the pixel area emit a first primary color light, a second primary color light and a third primary color light respectively.

In some embodiments, four sub-pixel areas constitute one pixel area and the light emitting assemblies in the four sub-pixel areas of the pixel area emit a first primary color light, a second primary color light, a third primary color light and a white light respectively.

An embodiment of the present disclosure provides an organic light emitting diode display panel, including: a substrate; a plurality of sub-pixel areas on the substrate, each of the plurality of sub-pixel areas comprising a light emitting region and a non-light emitting region; and a light emitting assembly arranged directly on a surface of the substrate in the light emitting region.

In some embodiments, the light emitting assembly comprises a first electrode, a second electrode and electroluminescent material between the first electrode and the second electrode, and the first electrode is in direct contact with the substrate.

An embodiment of the present disclosure also provides an organic light emitting diode display device comprising the organic light emitting diode display panel as described above.

An embodiment of the present disclosure also provides a method for producing an organic light emitting diode display panel, wherein the organic light emitting diode display panel comprises a plurality of sub-pixel areas, each of the plurality of sub-pixel areas comprising a light emitting region and a non-light emitting region, the method comprising: forming a plurality of insulation layers on a substrate, the plurality of insulation layers extending into the light emitting region from the non-light emitting region; removing a portion, in the light emitting region, of at least one of the plurality of insulation layers; and forming a light emitting assembly in the light emitting region on the substrate formed with the plurality of insulation layers.

In some embodiments, the removing the portion, in the light emitting region, of at least one of the plurality of insulation layers comprises: removing the portion, in the light emitting region, of each of the plurality of insulation layers, by dry etching process.

In some embodiments, the method further comprises: patterning portions, in the non-light emitting region, of the plurality of insulation layers.

In some embodiments, the removing the portion, in the light emitting region, of at least one of the plurality of insulation layers and the patterning the portion, in the non-light emitting region, of the at least one of the plurality of insulation layers are performed in a same patterning step.

In some embodiments, the forming the light emitting assembly in the light emitting region on the substrate formed with the plurality of insulation layers comprises: forming a first electrode on the substrate formed with the plurality of insulation layers; forming a pixel definition layer on the substrate formed with the first electrode, and forming an accommodating chamber in the pixel definition layer; injecting electroluminescent material into the accommodating chamber to form an electroluminescent layer; and forming a second electrode on the substrate formed with the pixel definition layer and the electroluminescent layer.

In some embodiments, the first electrode is in direct contact with the substrate.

BRIEF DESCRIPTION OF THE DRAWINGS

In order to explain the technical solutions of embodiments of the present disclosure or the related art, drawings that are needed to describe the embodiments or the related art will be described briefly below. Apparently, the following drawings only show some of the embodiments of the present disclosure. The skilled person in the art can obtain other drawings from these drawings without any creative efforts.

DETAILED DESCRIPTION OF EMBODIMENTS

Embodiments of the present disclosure will be explained explicitly and entirely below with reference to drawings. Apparently, the described embodiments are only some of the embodiments in the present disclosure, instead of all of embodiments in the present disclosure. All of other embodiments obtained by the skilled person in the art, from the embodiments of the present disclosure, fall within the scope of the present disclosure.

Figure 1:
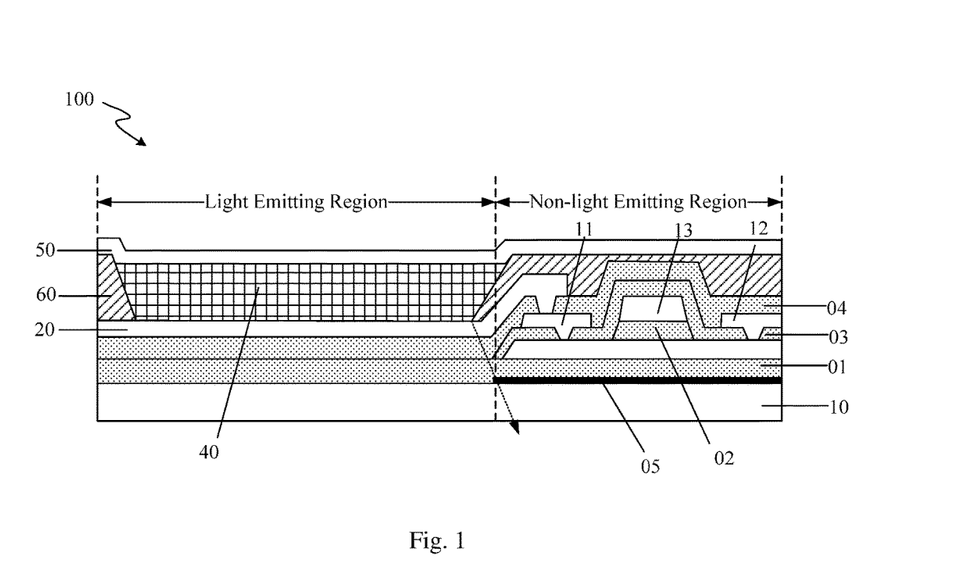
FIG. 1 is a schematic diagram showing a structure of a sub-pixel area of an OLED display panel according to an embodiment of the present disclosure.
Figure 2:
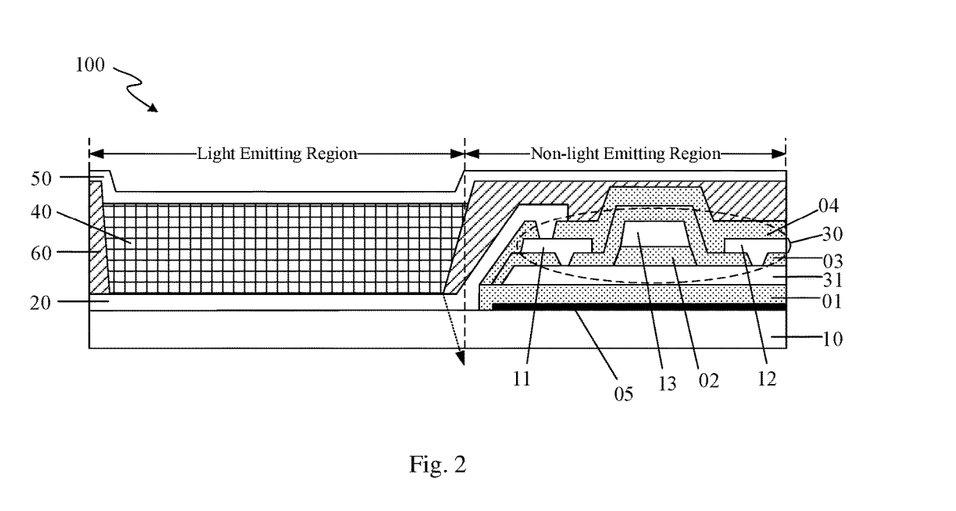
FIG. 2 is a schematic diagram showing a structure of a sub-pixel area of an OLED display panel according to another embodiment of the present disclosure.

An embodiment of the present disclosure provides an organic light emitting diode display panel. It includes a substrate 10 and a plurality of sub-pixel areas 100 on the substrate 10. FIG. 1 and FIG. 2 each show an example of the sub-pixel area 100. As illustrated in FIG. 1 and FIG. 2, each of the sub-pixel areas 100 includes a light emitting region and a non-light emitting region. A plurality of insulation layers (FIG. 1 and FIG. 2 show schematically four insulation layers) are provided in the non-light emitting region. A light emitting assembly 40 is arranged in the light emitting region. At most two insulation layers of the plurality of insulation layers extend from the non-light emitting region into the light emitting region and they are located between the light emitting assembly 40 and the substrate 10. Total number of the plurality of insulation layers in the non-light emitting region is greater than number of the insulation layers extending into the light emitting region from the non-light emitting region and located between the light emitting assembly 40 and the substrate 10. That is, part of the plurality of insulation layers in the non-light emitting region extend into a position between the light emitting assembly 40 and the substrate 10 in the light emitting region, but not all of the plurality of insulation layers extend into the light emitting region.

It should be noted that the OLED display panel herein may include the substrate 10 and structures required for display (for example, the thin film transistor and the light emitting assembly or the like) arranged on the substrate 10. Furthermore, it may further include a packaging structure (for example, a packaging thin film or a packaging substrate). When the light emitted from the light emitting assembly 40 is a white light, the display panel may further include a color filtering pattern.

As an example, the OLED display panel may include a plurality of insulation layers in the non-light emitting region, for example, including a combination of any ones of a buffer layer, a gate insulator (abbreviated as GI) layer, an interlayer dielectric (abbreviated as ILD) layer, and a passivation layer (PVX).

In an example, FIG. 1 and FIG. 2 show schematically that the OLED display panel includes four insulation layers in the non-light emitting region. In particular, the four insulation layers in the non-light emitting region include a buffer layer 01, a gate insulator layer 02, an interlayer dielectric layer 03 and a passivation layer 04. However, the embodiments of the present disclosure are not limited to this. For example, only two insulation layers (for example, two of the above listed insulation layers) may be arranged in the non-light emitting region while one insulation layer or no insulation layers are arranged between the light emitting assembly 40 and the substrate 10 in the light emitting region.

In some examples, the OLED display panel includes the light emitting assembly 40 that may emit light towards the substrate 10. For example, the display panel provided by the present disclosure may be a bottom light emitting type OLED display panel.

In an embodiment of the present disclosure, at most two insulation layers are provided between the light emitting assembly 40 and the substrate 10. That is, two insulation layers may be provided between the light emitting assembly 40 and the substrate 10, as shown in FIG. 1; or one insulation layer may be provided between the light emitting assembly 40 and the substrate 10; or no insulation layers may be provided between the light emitting assembly 40 and the substrate 10, as shown in FIG. 2.

In the embodiment, at most two insulation layers of the plurality of insulation layers extending into the light emitting region from the non-light emitting region means, as shown in FIG. 1, the non-light emitting region includes four insulation layers and the light emitting region includes only two insulation layers in the above four insulation layers and other two insulation layers do not extend into the light emitting region. The other two insulation layers are arranged only in the non-light emitting region but absent in the light emitting region. In this way, as shown in FIG. 1 and FIG. 2, the dashed arrow represents an optical path at an edge of an illumination range of the light emitting region. The less the number of the insulation layers between the light emitting assembly 40 and the substrate 10 is, the less the amount of light emitted from the light emitting assembly 40 reaches the non-light emitting region.

In case that the thin film transistor is arranged in the non-light emitting region, once the light emitted from the light emitting region is directly incident onto an active layer of the thin film transistor in the non-light emitting region or reflected to the active layer of the thin film transistor in the non-light emitting region, it may cause a threshold voltage of the thin film transistor to generate a negative drift so as to lead to change of characteristics of the thin film transistor, to cause electric leak of the pixel and abnormal display. Thus, it is desired that the light emitted from the light emitting assembly 40 reaches the non-light emitting region as little as possible. Reduction of the number of the insulation layers between the light emitting assembly 40 and the substrate 10 facilitates reducing a distance between the light emitting assembly 40 and the substrate 10, so as to reduce the light emitted from the light emitting assembly 40 reaching the non-light emitting region.

Certainly, as required, the insulation layers that are only in the light emitting region and do not extend into the non-light emitting region may be arranged between the light emitting assembly 40 and the substrate 10.

As an example, the substrate 10 may be a glass substrate, or may be a flexible substrate.

In the OLED display panel provided by the embodiments of the present disclosure, part of the plurality of insulation layers in the non-light emitting region extend into the light emitting region, but not all of the plurality of insulation layers in the non-light emitting region extend into the light emitting region. It can reduce chance that the light emitted from the light emitting assembly reaches the non-light emitting region such that it is less possible for the light emitted from the light emitting assembly to reach directly the active layer and it is also less possible for the light emitted from the light emitting assembly to be reflected by a metal layer (for example an electrode layer or a light shielding layer) of the thin film transistor to the active layer. In this way, influence of the light on the thin film transistor in the non-light emitting region can be reduced, so as to reduce the influence of the light emitted from the light emitting assembly on the characteristics of the thin film transistor in the non-light emitting region.

In some examples, as illustrated in FIG. 2, the non-light emitting region includes a thin film transistor 30, and a distance between a surface (it is a lower surface in FIG. 2) of the light emitting assembly 40 facing the substrate 10 and the substrate 10 is smaller than a distance between a surface (it is a lower surface in FIG. 2) of an active layer 31 of the thin film transistor 30 facing the substrate 10 and the substrate 10.

That is, the distance between the lower surface of the first electrode 20 in the light emitting assembly 40 and the substrate is smaller than the distance between the lower surface of the active layer 31 and the substrate 10. For example, the thin film transistor is a bottom gate type thin film transistor. The insulation layers between the active layer and the substrate include the buffer layer and the gate insulator layer, but the insulation layers between the first electrode and the substrate only include the buffer layer or only include the gate insulator layer.

In embodiments, the thin film transistor may be a bottom gate type thin film transistor, or may be a top gate type thin film transistor. In the embodiment of the present disclosure, shown in FIG. 1 and FIG. 2, the thin film transistor is the top gate type thin film transistor. Depending on materials of the active layer, the thin film transistor may be for example an amorphous silicon thin film transistor, a polycrystalline silicon thin film transistor, a metal oxide thin film transistor, an organic thin film transistor or the like. In view of this, the thin film transistor may also be of staggered type, oppositely-staggered type, coplanar type or oppositely-coplanar type, or the like.

As an example, as shown in FIG. 1 and FIG. 2, the thin film transistor includes a source electrode 11, a drain electrode 12, a gate electrode 13 and an active layer 31. In this case, the plurality of insulation layers may include: a first insulation layer (for example the buffer layer 01) between the substrate 10 and the active layer 31; a second insulation layer (for example the interlayer dielectric layer 03) between the active layer 31 and the source electrode 11 and the drain electrode 12; a third insulation layer (for example the gate insulator layer 02) between the active layer 31 and the gate electrode 13; and a fourth insulation layer (for example the passivation layer 04) covering the source electrode 11 and the drain electrode 12. As an example, a light shielding layer 05 may be arranged between the substrate 10 and the first insulation layer. The light shielding layer 05 may be configured to shield stray light (natural light). In addition, the lower surface of the active layer 31 herein means the surface of the active layer 31 facing the substrate 10; the lower surface of the light emitting assembly 40 herein means the surface of the light emitting assembly 40 facing the substrate 10, in particular, means the surface of the first electrode 20 facing the substrate 10, the first electrode 20 being arranged in the light emitting assembly 40 close to the substrate 10.

In the embodiment of the present disclosure, the distance between the lower surface of the light emitting assembly and the substrate 10 is smaller than the distance between the lower surface of the active layer 31 and the substrate 10. In this way, the chance that the light emitted from the light emitting assembly reaches directly the active layer 31 may be further reduced and the chance that the light emitted from the light emitting assembly 40 is reflected by the metal layer of the thin film transistor 30 to the active layer 31 may also be reduced, to further reduce the influence of the light emitted from the light emitting assembly on the characteristics of the thin film transistor.

In another embodiment, as shown in FIG. 2, the light emitting assembly 40 is arranged directly on a surface of the substrate 10.

That is, the first electrode 20 of the light emitting assembly 40 is in direct contact with the substrate 10 and there are not any other film layers between the first electrode 20 of the light emitting assembly 40 and the substrate 10. For example, the substrate 10 may be a glass substrate.

In the OLED display panel provided by the present disclosure, the light emitting assembly 40 is arranged directly on the substrate 10 such that the light emitted downwards (towards the substrate 10) from the light emitting assembly is incident at a particular small angle onto the active layer and the metal layer of the thin film transistor in the non-light emitting region while the light emitted towards lateral sides may be blocked by the pixel definition layer (PDL). In this way, the thin film transistor may substantially avoid the influence of the light on the characteristics of the thin film transistor.

Furthermore, in a typical OLED display panel, an organic resin layer is typically arranged below the first electrode 20. The organic resin layer may have a thickness of up to about 3.2 μm and the first electrode 20 typically has a thickness of about 0.07 μm. It may cause the first electrode 20 to be uneven. In contrast, in some of the embodiments of the present disclosure, the first electrode 20 in the light emitting assembly 40 is arranged directly on the surface of the substrate 10 without any film layers such as the organic resin layer on the side of the first electrode 20 facing the substrate 10. It may ensure the flatness of the first electrode 10. The performance of the light emitting assembly 40 depends on the flatness of the first electrode 20. Thus, the structure provided by the present disclosure is helpful to improving the performance of the light emitting assembly and improving uniformity and stability of products made by ink-jet printing (abbreviated as IJP) technology, so as to improve lifetime and performance of the products.

Again, for example, in a typical OLED display panel, during producing the first electrode 20, it may need to pass through a hole in an organic resin layer, a hole in a planarization layer, a hole in an interlayer dielectric layer, a hole in a buffer layer or the like. The organic resin layer may have a thickness of up to about 3.2 µm. The planarization layer may have a thickness of up to about 0.35 µm. The interlayer dielectric layer may have a thickness of up to about 0.55 µm. The buffer layer may have a thickness of up to about 0.4 µm. In some embodiments of the present disclosure, during producing the first electrode 20, it needn't to pass through the hole in the organic resin layer. It may relatively reduce difference in corner segments during forming the first electrode 20.

As an example, as shown in FIG. 1 and FIG. 2, the light emitting assembly includes a first electrode 20, a second electrode 50 and an electroluminescent layer 40 between the first electrode 20 and the second electrode 50. The electroluminescent layer 40 may be defined by the pixel definition layer 60. For example, an accommodating chamber may be arranged in the pixel definition layer 60. The electroluminescent material may for example be injected into the accommodating chamber by ink-jet printing to form the electroluminescent layer 40.

As an example, the first electrode 20 may be a transparent electrode, for example may be an ITO (Indium tin oxide) electrode. The second electrode 50 may for example be a metal electrode. One of the first electrode 20 and the second electrode 50 is a cathode, the other of the first electrode 20 and the second electrode 50 is an anode.

As an example, the light emitting assembly 40 may further include a hole transport layer, a hole injection layer, an electronic transport layer, an electronic injection layer, or the like.

Figure 3:
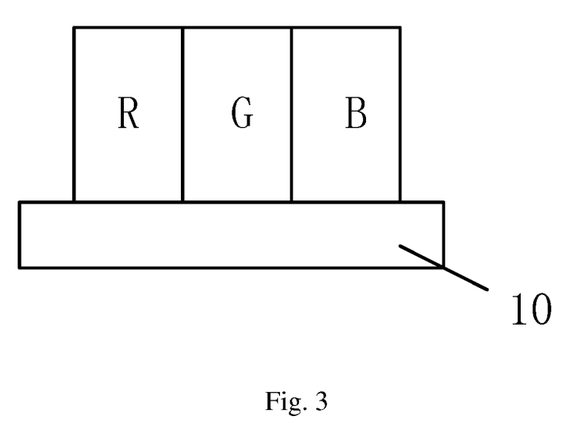
FIG. 3 is a schematic diagram showing a structure of a pixel area of an OLED display panel according to an embodiment of the present disclosure, in which one pixel area is composed of three sub-pixel areas.

In an embodiment, as shown in FIG. 3, three sub-pixel areas R, G, B constitute one pixel area and the light emitting assemblies in the three sub-pixel areas of the pixel area emit a first primary color light, a second primary color light and a third primary color light respectively.

Figure 4:
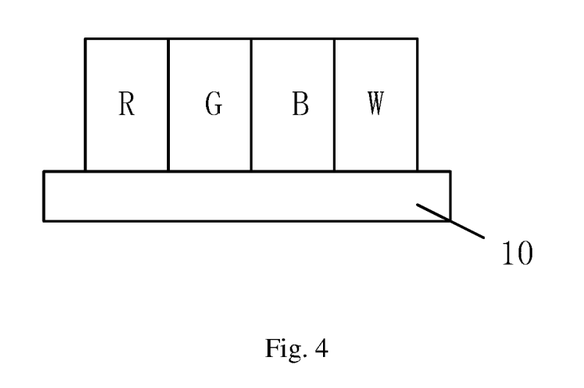
FIG. 4 is a schematic diagram showing a structure of a pixel area of an OLED display panel according to another embodiment of the present disclosure, in which one pixel area is composed of four sub-pixel areas.

In another embodiment, as shown in FIG. 4, four sub-pixel areas R, G, B and W constitute one pixel area and the light emitting assemblies in the four sub-pixel areas of the pixel area emit a first primary color light, a second primary color light, a third primary color light and a white light respectively.

The detailed views of examples of a single sub-pixel area have been shown in FIG. 1 and FIG. 2, thus, FIG. 3 and FIG. 4 only give schematic representations of the sub-pixel areas.

In an embodiment, the first primary color, the second primary color and the third primary color may be different from each other as long as they are three primary colors. The first primary color, the second primary color and the third primary color may be red, blue and green respectively. For example, the first primary color is red; the second primary color is yellow; and the third primary color is green. Certainly, other combinations of colors are also available. Or, the first primary color, the second primary color and the third primary color may be cyan blue, magenta and yellow respectively. For example, the first primary color is cyan blue; the second primary color is magenta; and the third primary color is yellow. Certainly, other combinations of colors are also available.

One pixel area may not only include three sub-pixel areas that emit lights with different primary colors respectively, but also include one sub-pixel area that emits a white light. For example, one pixel area includes three sub-pixel areas that emit a red light, a blue light and a green light respectively; or one pixel area includes three sub-pixel areas that emit a cyan blue light, a magenta light and a yellow light respectively; or each of the pixel areas as described in the above two forms may further include a sub-pixel area that emits a white light.

In the embodiment of the present disclosure, the light emitting unit may emit a colored light. It may remove a color filtering pattern from the OLED display panel, thereby it may reduce product cost, and may make the OLED display panel lighter and thinner.

An embodiment of the present disclosure also provides an organic light emitting diode display panel. The organic light emitting diode display panel includes a substrate and a plurality of sub-pixel areas on the substrate. Each of the plurality of sub-pixel areas includes a light emitting region and a non-light emitting region. The organic light emitting diode display panel may further include a light emitting assembly arranged directly on a surface of the substrate in the light emitting region.

It should be noted that, firstly, the OLED display panel herein may be a top light emitting type OLED display panel (for example, the first electrode 20 is a metal electrode and the second electrode 50 is a transparent electrode), or it may alternatively be a bottom light emitting type OLED display panel (for example, the first electrode 20 is a transparent electrode and the second electrode 50 is a metal electrode).

Secondly, the light emitting assembly is arranged directly on the surface of the substrate, and there are not any other film layers between the light emitting assembly and the substrate.

In the OLED display panel provided by the embodiments of the present disclosure, the light emitting assembly is arranged directly on the substrate. It may ensure the flatness of the first electrode of the light emitting assembly that is arranged close to the substrate. It is helpful to improving uniformity and stability of products made by ink-jet printing (abbreviated as IJP) technology, so as to improve lifetime and performance of the products.

An embodiment of the present disclosure also provides an organic light emitting diode display device including the organic light emitting diode display panel as described above.

The OLED display device provided by the present disclosure have the same advantageous effects as the above OLED display panel. The details will be omitted here.

Figure 5:
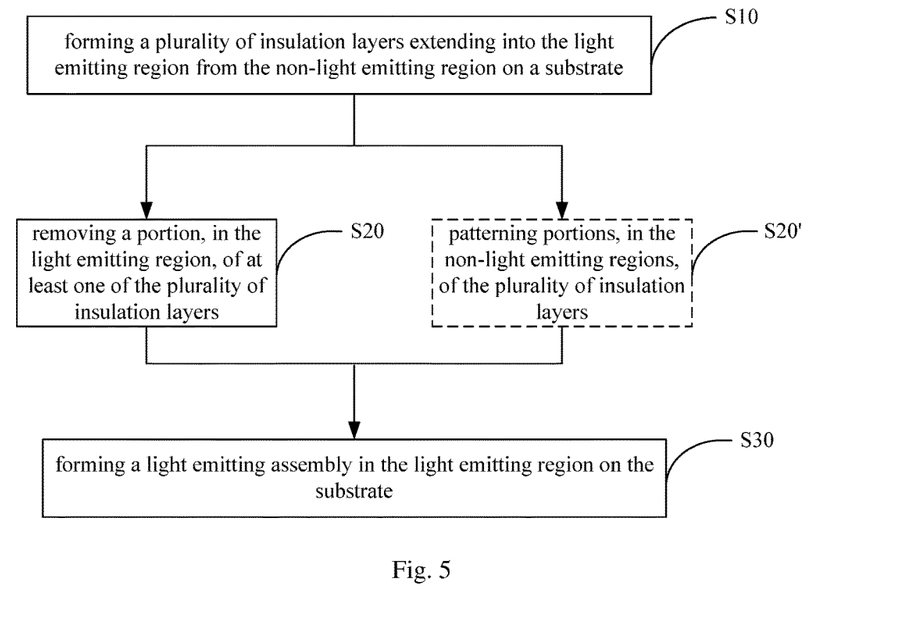
FIG. 5 is a flow chart of a method for producing an OLED display panel according to an embodiment of the present disclosure.

An embodiment of the present disclosure also provides a method for producing an organic light emitting diode display panel. The organic light emitting diode display panel includes a plurality of sub-pixel areas. Each of the plurality of sub-pixel areas includes a light emitting region and a non-light emitting region. As illustrated in FIG. 5, the method includes:

Step S10 of forming a plurality of insulation layers on a substrate 10, the plurality of insulation layers extending into the light emitting region from the non-light emitting region; and Step S20 of removing a portion, in the light emitting region, of at least one of the plurality of insulation layers.

Figure 6:
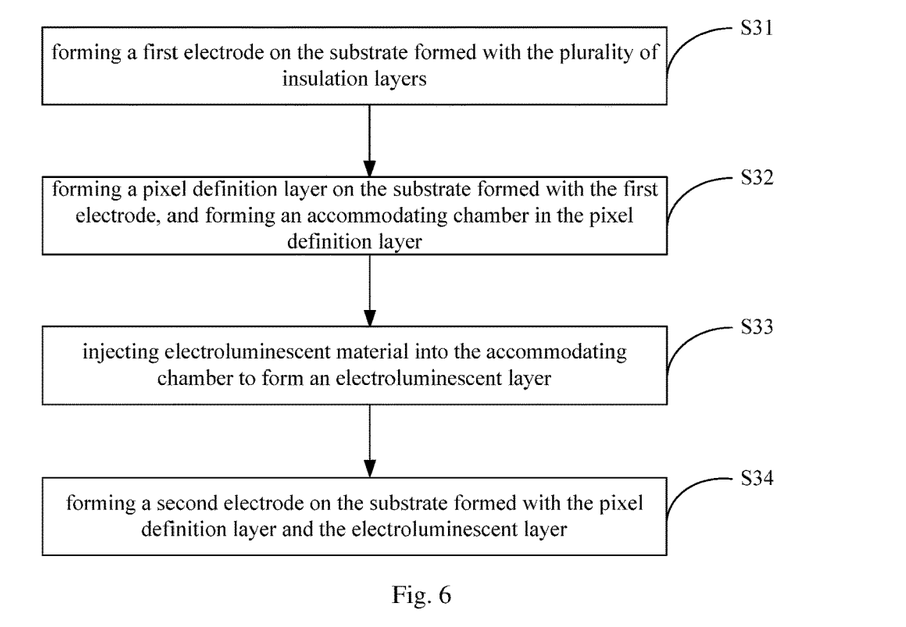
FIG. 6 shows exemplary specific steps in the step S30 of the method shown in FIG. 5.

That is, as shown in FIG. 6, the plurality of insulation layers are formed on the substrate (located in the light emitting region and the non-light emitting region) and a portion of some film layers in the light emitting region are removed, so that only at most two film layers are maintained in the light emitting region. In the figure, blank parts defined by dashed blocks represent the portions that need to be removed in the producing process, for example, they may be removed by a dry etching process.

It should be noted that in the related art, during producing the OLED display panel, there are processes for etching the insulation layers in the non-light emitting region. Thus, when the insulation layers in the present disclosure are produced (the insulation layers in the light emitting region are removed), it only needs to add the corresponding patterns on an original mask.

The above method may further include:

Step S30 of forming a light emitting assembly in the light emitting region on the substrate 10 formed with the plurality of insulation layers.

The processes for forming the light emitting assembly may be performed by the conventional processes. The materials of the insulation layers may for example be silicon nitride or silicon oxide, or the like.

In the method for producing the OLED display panel provided by the embodiment of the present disclosure, without increasing processes and processing difficulty, the produced OLED display panel may only make some of the plurality of insulation layers in the non-display area extend into the display area. It may reduce chance that the light emitted from the light emitting assembly reaches the non-light emitting region such that it is less possible for the light emitted from the light emitting assembly to reach directly the active layer and it is also less possible for the light emitted from the light emitting assembly to be reflected by a metal layer of the thin film transistor to the active layer. In this way, influence of the light on the thin film transistor in the non-light emitting region can be reduced, so as to reduce the influence of the light emitted from the light emitting assembly on the characteristics of the thin film transistor in the non-light emitting region.

As an example, the Step S20 may include:

Step S21 of removing the portion, in the light emitting region, of each of the plurality of insulation layers, by a dry etching process.

In this way, the light emitting assembly 40 may be arranged directly on the substrate 10. As an example, the above method may further include:

Step S20' of patterning portions, in the non-light emitting regions, of the plurality of insulation layers.

Figure 7:
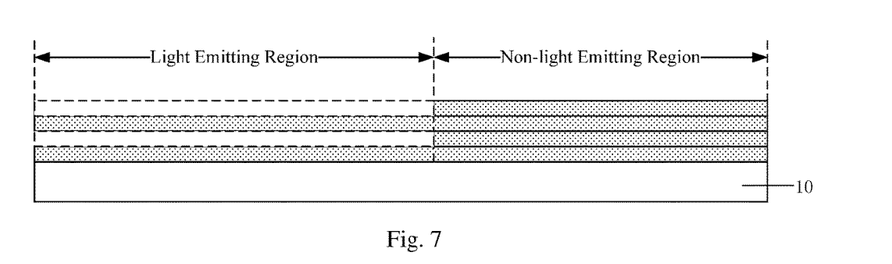
FIG. 7 is a simplified schematic view showing a process for producing an OLED display panel according to an embodiment of the present disclosure.
Figure 8:
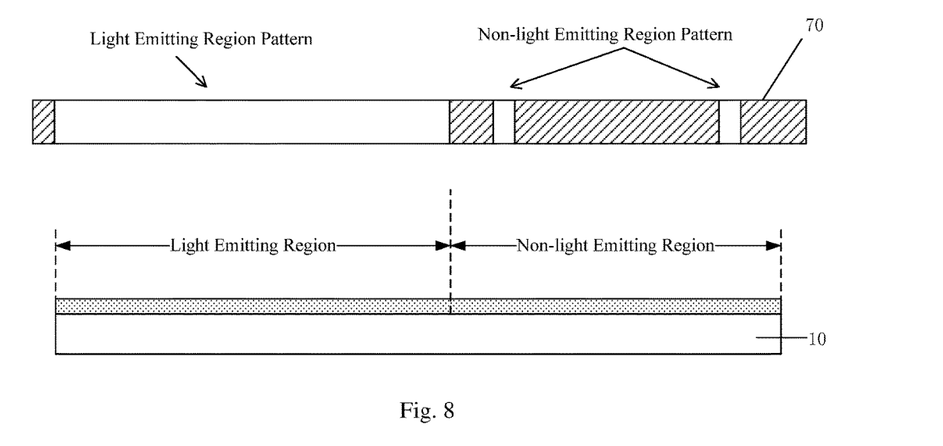
FIG. 8 is a schematic view showing a mask for patterning the portions of the insulation layers in the non-light emitting region and the light emitting region simultaneously.

In some embodiments, in order to avoid increasing processes, the above step S20 may be performed during the above step S20'; in other words, the step of removing the portion, in the light emitting region, of at least one of the plurality of insulation layers and the step of patterning the portion, in the non-light emitting region, of the at least one of the plurality of insulation layers are performed in a same patterning step. It may be achieved by adding the corresponding pattern into the mask configured to pattern the corresponding insulation layers, as shown in FIG. 7. FIG. 7 shows the mask 70. Light emitting region patterns and non-light emitting region patterns are arranged on positions in the mask 70 corresponding to the light emitting region and the non-light emitting region respectively, so as to pattern the portions of the insulation layers in the light emitting region and in the non-light emitting region on the substrate at the same time. The step S20' may for example be configured to form structures of the thin film transistor or other structures (such as via holes).

In an example, it is possible to form only one insulation layer and pattern it only once, so that the finally formed insulation layer is located only in the non-light emitting region.

In an embodiment of the present disclosure, the Step S30 may include:

Step S31: forming a first electrode 20 on the substrate 10 formed with the plurality of insulation layers;

Step S32: forming a pixel definition layer 60 on the substrate formed with the first electrode 20, and forming an accommodating chamber in the pixel definition layer;

Step S33: injecting electroluminescent material into the accommodating chamber to form an electroluminescent layer; and Step S34: forming a second electrode on the substrate formed with the pixel definition layer and the electroluminescent layer.

The above Step S33 may for example be achieved by ink-jet printing technology.

The ink-jet printing (IJP) technology will be popular in the future due to advantages of for example low power consumption, low cost, high resolution, high color range. The IJP may be used to achieve monochromatic printing, thus, when material color points meet the requirements, the color filter may not be needed. In the present disclosure, the first electrode is deposited directly on the substrate 10 by changing the design of opening in comparison with the related art. The insulation layers such as the ILD layer, the buffer layer and the passivation layer in the light emitting region during the processes in the related art are removed by the dry etching process. On one hand, it avoids unevenness of surfaces of the first electrode 10 which may occur in the related art. The unevenness may cause the electroluminescent material not to be expanded well, to degrade the lifetime and color range of products. On the other hand, the present disclosure can effectively prevent the thin film transistor in the non-light emitting region from being affected by the light irradiation.

The above embodiments are only some exemplary embodiments of the present disclosure. The scope of the present disclosure is not limited to this. Modification or variation can be made easily by those skilled in the art to the embodiments without departing the scope of the present disclosure should fall within the scope of the present disclosure. Thus, the scope of the present disclosure should be delimited by the appended claims and equivalents thereof.

What is claimed is:

1. An organic light emitting diode display panel, comprising:
    a substrate; and
    a plurality of sub-pixel areas on the substrate, each of the plurality of sub-pixel areas comprising a light emitting region and a non-light emitting region,
    wherein a plurality of insulation layers are in the non-light emitting region and a light emitting assembly is in the light emitting region, and
    wherein at most two insulation layers of the plurality of insulation layers extend from the non-light emitting region into the light emitting region between the light emitting assembly and the substrate, and wherein a total number of the plurality of insulation layers in the non-light emitting region is greater than a number of the insulation layers extending from the non-light emitting region into the light emitting region between the light emitting assembly and the substrate, and wherein the non-light emitting region comprises a thin film transistor comprising an active layer, and a distance between a surface of the light emitting assembly facing the substrate and the substrate is smaller than a distance between a surface of the active layer facing the substrate and the substrate.

2. The organic light emitting diode display panel according to claim 1, wherein the light emitting assembly is arranged directly on a surface of the substrate.

3. The organic light emitting diode display panel according to claim 1, wherein the plurality of insulation layers comprise at least two of a buffer layer, a gate insulator layer, an interlayer dielectric layer and a passivation layer.

4. The organic light emitting diode display panel according to claim 1, wherein the light emitting assembly emits light towards the substrate.

5. The organic light emitting diode display panel according to claim 1, wherein the light emitting assembly comprises a first electrode, a second electrode and an electroluminescent layer between the first electrode and the second electrode.

6. The organic light emitting diode display panel according to claim 5, wherein the first electrode is in direct contact with the substrate.

7. The organic light emitting diode display panel according to claim 1, wherein the substrate is a glass substrate.

8. The organic light emitting diode display panel according to claim 1, wherein three sub-pixel areas of the plurality of sub-pixel areas constitute one pixel area, and the light emitting assemblies in the three sub-pixel areas of the pixel area emit a first primary color light, a second primary color light and a third primary color light, respectively.

9. The organic light emitting diode display panel according to claim 1, wherein four sub-pixel areas of the plurality of sub-pixel areas constitute one pixel area and the light emitting assemblies in the four sub-pixel areas of the pixel area emit a first primary color light, a second primary color light, a third primary color light and a white light, respectively.

10. An organic light emitting diode display device comprising the organic light emitting diode display panel according to claim 1.

11. A method for producing an organic light emitting diode display panel, wherein the organic light emitting diode display panel comprises a plurality of sub-pixel areas, each of the plurality of sub-pixel areas comprising a light emitting region and a non-light emitting region, the method comprising:

forming a plurality of insulation layers on a substrate, the plurality of insulation layers extending into the light emitting region from the non-light emitting region;

removing a portion, in the light emitting region, of at least one of the plurality of insulation layers; and forming a light emitting assembly in the light emitting region on the substrate formed with the plurality of insulation layers, wherein the method further comprises:
patterning portions, in the non-light emitting region, of the plurality of insulation layers.

12. A method for producing an organic light emitting diode display panel, wherein the organic light emitting diode display panel comprises a plurality of sub-pixel areas, each of the plurality of sub-pixel areas comprising a light emitting region and a non-light emitting region, the method comprising:

forming a plurality of insulation layers on a substrate, the plurality of insulation layers extending into the light emitting region from the non-light emitting region;

removing the portion, in the light emitting region, of each of the plurality of insulation layers, by a dry etching process; and forming a light emitting assembly in the light emitting region on the surface formed with the plurality of insulation layers.

13. The method according to claim 11, wherein removing the portion, in the light emitting region, of at least one of the plurality of insulation layers, and patterning the portions, in the non-light emitting region, of the plurality of insulation layers are performed in a same patterning step.

14. The method according to claim 11, wherein forming the light emitting assembly in the light emitting region on the substrate formed with the plurality of insulation layers comprises:

forming a first electrode on the substrate formed with the plurality of insulation layers;

forming a pixel definition layer on the substrate formed with the first electrode, and forming an accommodating chamber in the pixel definition layer;

injecting electroluminescent material into the accommodating chamber to form an electroluminescent layer; and forming a second electrode on the substrate formed with the pixel definition layer and the electroluminescent layer.

15. The method according to claim 14, wherein the first electrode is in direct contact with the substrate.

* * * * *